United States Patent
Kaida et al.

(10) Patent No.: US 8,340,147 B2
(45) Date of Patent: Dec. 25, 2012

(54) LASER DIODE

(75) Inventors: Noriaki Kaida, Yokohama (JP);
Takahiko Kawahara, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/902,450

(22) Filed: Oct. 12, 2010

(65) Prior Publication Data

US 2011/0090928 A1    Apr. 21, 2011

(30) Foreign Application Priority Data

Oct. 20, 2009    (JP) ................ 2009-241699

(51) Int. Cl.
*H01S 5/00*    (2006.01)
(52) U.S. Cl. ................ 372/46.012
(58) Field of Classification Search ........ 372/46.012
See application file for complete search history.

(56) References Cited

U.S. PATENT DOCUMENTS 6,822,989 B1 * 11/2004 Fukuhisa et al. .......... 372/43.01
2004/0048406 A1 * 3/2004 Ikeda et al. ................ 438/29

FOREIGN PATENT DOCUMENTS

JP    2-206192    8/1990

* cited by examiner

*Primary Examiner* — Patrick Stafford
(74) *Attorney, Agent, or Firm* — Smith, Gambrell & Russell, LLP

(57) ABSTRACT

A laser diode includes an n-type semiconductor region, a p-type semiconductor region, a semiconductor mesa provided between the n-type semiconductor region and the p-type semiconductor region, the semiconductor mesa including an active layer, and a semiconductor burying region located between the n-type semiconductor region and the p-type semiconductor region, the semiconductor burying region being provided on a side face of the semiconductor mesa. The semiconductor burying region includes an n-type semiconductor burying layer and a p-type semiconductor burying layer. The n-type semiconductor burying layer is provided between the p-type semiconductor region and the p-type semiconductor burying layer. The p-type semiconductor burying layer is doped with an element that forms an electron trapping level in the band gap of the p-type semiconductor burying layer.

18 Claims, 8 Drawing Sheets

LASER DIODE

BACKGROUND OF THE INVENTION

1. Field of the Invention

The present invention relates to a laser diode.

2. Description of the Related Art

A buried heterostructure (BH) has been known as one of the structures of laser diodes used in fiber-optic communications. A BH laser diode includes a stripe-shaped semiconductor mesa portion and burying layers which are arranged on both sides of the semiconductor mesa portion. The semiconductor mesa portion includes an active layer. The BH laser diode can strongly confine light and current in a portion near the active layer. The BH laser diode thus has excellent properties, i.e., a low threshold current, high slope efficiency, and high output power. The burying layers may be composed of a semi-insulating semiconductor. The BH laser diode including the burying layers composed of the semi-insulating semiconductor has a low parasitic capacitance and excellent high-frequency characteristics. For this reason, the BH laser diode is suitably used as a light source for use in fiber-optic communications.

Japanese Unexamined Patent Application Publication No. 02-206192 discloses such a BH laser diode. The BH laser diode disclosed in this patent document includes a semi-insulating semiconductor layer and an n-type semiconductor layer formed on the semi-insulating semiconductor layer as semiconductor burying layers. The semi-insulating semiconductor layer is composed of, for example, Fe-doped InP. The n-type semiconductor layer is composed of, for example, n-type InP. A p-type semiconductor layer (p-type cladding layer) is formed on a semiconductor mesa and the n-type semiconductor layer of the semiconductor burying layers.

SUMMARY OF THE INVENTION

In the laser diode disclosed in the patent document described above, the n-type semiconductor layer included in the semiconductor burying layers mainly inhibits the penetration of holes from the p-type cladding layer into the semiconductor burying layers. Meanwhile, the semi-insulating semiconductor layer included in the semiconductor burying layers inhibits the penetration of electrons from an n-type semiconductor substrate into the semiconductor burying layers. The semi-insulating semiconductor layer is doped with elements of Fe and Ru that form deep acceptor levels. These elements of Fe and Ru trap electrons at the acceptor levels. Thus, electrons that mainly penetrate from an n-type semiconductor substrate into the semiconductor burying layers are trapped by the Fe and Ru elements doped in the semi-insulating semiconductor layer. The semi-insulating semiconductor layer may inhibit electrons from reaching the p-type cladding layer. Therefore, the semiconductor burying layers having the structure described above inhibit both carriers, i.e., electrons and holes, from leaking through the semiconductor burying layers. That is, it is possible to effectively reduce leakage current flowing through the semiconductor burying layers.

However, an increase in the number of electrons penetrating into the semi-insulating semiconductor layer causes saturation of the effect of capturing electrons at the acceptor levels. So, the semi-insulating semiconductor sublayers fail to sufficiently inhibit the transfer of electrons, thereby increasing leakage current. Thus, a BH laser diode of the related art does not sufficiently inhibit leakage current flowing through the semiconductor burying layers, in some cases. When the leak current is increased, a current is not concentrated at an active layer provided in the semiconductor mesa, thus disadvantageously causing a reduction in optical output power or a reduction in slope efficiency.

A laser diode according to a first aspect of the present invention includes an n-type semiconductor region, a p-type semiconductor region, a semiconductor mesa provided between the n-type semiconductor region and the p-type semiconductor region, the semiconductor mesa including an active layer, and a semiconductor burying region located between the n-type semiconductor region and the p-type semiconductor region, the semiconductor burying region being provided on a side face of the semiconductor mesa. The semiconductor burying region includes a p-type semiconductor burying layer and an n-type semiconductor burying layer provided between the p-type semiconductor region and the p-type semiconductor burying layer. The p-type semiconductor burying layer is doped with a p-type dopant and an element that forms an electron trapping level in a band gap of the p-type semiconductor burying layer.

In the laser diode according to the first aspect of the present invention, the n-type semiconductor burying layer inhibits the penetration of holes from the p-type semiconductor region into the semiconductor burying region. Furthermore, a potential barrier in the conduction band is formed between the n-type semiconductor region and the p-type semiconductor burying layer. The potential barrier suppresses the transfer of electrons from the n-type semiconductor region to the p-type semiconductor burying layer. The p-type semiconductor burying layer is doped with a p-type dopant and an element that forms an electron trapping level in the band gap of the p-type semiconductor burying layer. Therefore, electrons that have passed over the potential barrier and have moved to the p-type semiconductor burying layer are trapped at the electron trapping level which is in an unoccupied state. Holes are present in the valence band of the p-type semiconductor burying layer. Thus, electrons that have been trapped at the electron trapping level are recombined with the holes in the valence band of the p-type semiconductor burying layer to disappear. As a result, the electron trapping level is in an unoccupied state again, so that the foregoing electron-trapping effect at the electron trapping level is recovered. Thus, the electron-trapping effect at the electron trapping level is not easily saturated. Accordingly, the electrons that have been transferred to the p-type semiconductor burying layer are effectively prevented from being transferred to the p-type semiconductor region.

Therefore, the laser diode according to the first aspect of the present invention makes it possible to inhibit leakage current flowing from the p-type semiconductor region to the p-type semiconductor region through the semiconductor burying region.

In the laser diode according to the first aspect of the present invention, the p-type semiconductor burying layer may have a higher concentration of the p-type dopant than that of the element that forms the electron trapping level in the band gap of the p-type semiconductor burying layer. For this laser diode, the electron-trapping effect at the electron trapping level is further maintained without saturation because of the efficient recombination between electrons and holes through the electron trapping level in the p-type semiconductor burying layer. Therefore, the leakage current through the semiconductor burying region may be reduced to improve the laser performance such as low threshold current and high power characteristics.

In the laser diode according to the first aspect of the present invention, the semiconductor burying region may further include an intermediate semiconductor burying layer provided between the n-type semiconductor burying layer and the p-type semiconductor burying layer. The intermediate semiconductor burying layer is preferably composed of an undoped semiconductor or a semi-insulating semiconductor. Thus, the semiconductor burying region includes the intermediate semiconductor burying layer composed of a high-resistivity material. Hence, the parasitic capacitance between the n-type semiconductor region and the p-type semiconductor region is reduced to improve the operating speed (high-frequency characteristics).

In the laser diode according to the first aspect of the present invention, the semiconductor burying region may further include an additional semiconductor burying layer provided between the n-type semiconductor region and the p-type semiconductor burying layer. The additional semiconductor burying layer may be a p-type semiconductor layer. Preferably, the additional semiconductor burying layer is not doped with an element that forms an electron trapping level in a band gap of the additional semiconductor burying layer. In this case, trapping and recombination on a side of the active layer having the highest electron density can be reduced. Therefore, an increase in threshold current due to the loss of electrons can be avoided and leakage current can be reduced. Furthermore, in the laser diode according to the first aspect of the present invention, the semiconductor burying region may further include an intermediate semiconductor burying layer provided between the n-type semiconductor burying layer and the p-type semiconductor burying layer, and an additional semiconductor burying layer provided between the n-type semiconductor region and the p-type semiconductor burying layer.

In the laser diode according to the first aspect of the present invention, each of the n-type semiconductor burying layer and the p-type semiconductor burying layer may be composed of a group III-V compound semiconductor.

In the laser diode according to the first aspect of the present invention, each of the n-type semiconductor burying layer and the p-type semiconductor burying layer may be composed of InP.

In the laser diode according to the first aspect of the present invention, the p-type semiconductor burying layer may contain at least one of Zn, Be, and Mg as the p-type dopant.

In the laser diode according to the first aspect of the present invention, the element that forms an electron trapping level in the band gap of the p-type semiconductor burying layer may be at least one of Fe and Ru.

A laser diode according to a second aspect of the present invention includes an n-type semiconductor region, a p-type semiconductor region, a semiconductor mesa provided between the n-type semiconductor region and the p-type semiconductor region, the semiconductor mesa including an active layer, and a semiconductor burying region located between the n-type semiconductor region and the p-type semiconductor region, the semiconductor burying region being provided on a side face of the semiconductor mesa. The semiconductor burying region includes an n-type semiconductor burying layer and a p-type semiconductor burying layer provided between the n-type semiconductor region and the n-type semiconductor burying layer. The n-type semiconductor burying layer is doped with an n-type dopant and an element that forms a hole trapping level in a band gap of the n-type semiconductor burying layer.

In the laser diode according to the second aspect of the present invention, the p-type semiconductor burying layer inhibits the penetration of electrons from the n-type semiconductor region into the semiconductor burying region. Furthermore, a potential barrier in the valence band is formed between the p-type semiconductor region and the n-type semiconductor burying layer. The potential barrier suppresses the transfer of holes from the p-type semiconductor region to the n-type semiconductor burying layer. The n-type semiconductor burying layer is doped with an n-type dopant and an element that forms a hole trapping level in the band gap of the n-type semiconductor burying layer. Therefore, holes that have passed over the potential barrier and have moved to the n-type semiconductor burying layer are trapped at the hole trapping level which is in an unoccupied state. Electrons are present in the conduction band of the n-type semiconductor burying layer. Thus, holes that have been trapped at the hole trapping level are recombined with the electrons in the conduction band of the n-type semiconductor burying layer to disappear. As a result, the hole trapping level is in an unoccupied state again, so that the foregoing hole-trapping effect at the hole trapping level is recovered. Thus, the hole-trapping effect at the hole trapping level is not easily saturated. Accordingly, the holes that have been transferred to the n-type semiconductor burying layer are effectively prevented from being transferred to the n-type semiconductor region.

Therefore, the laser diode according to the second aspect of the present invention makes it possible to inhibit leakage current flowing from the p-type semiconductor region to the n-type semiconductor region through the semiconductor burying region.

In the laser diode according to the second aspect of the present invention, the n-type semiconductor burying layer may have a higher concentration of the n-type dopant than that of the element that forms the hole trapping level in the band gap of the n-type semiconductor burying layer. For this laser diode, the hole-trapping effect at the hole trapping level is further maintained without saturation because of the efficient recombination between electrons and holes through the hole trapping level in the n-type semiconductor burying layer. Therefore, the leakage current through the semiconductor burying region may be reduced to improve the laser performance such as low threshold current and high power characteristics.

In the laser diode according to the second aspect of the present invention, the semiconductor burying region may further include an intermediate semiconductor burying layer provided between the n-type semiconductor burying layer and the p-type semiconductor burying layer. The intermediate semiconductor burying layer is preferably composed of an undoped semiconductor or a semi-insulating semiconductor. Thus, the semiconductor burying region includes the intermediate semiconductor burying layer composed of a high-resistivity material. Hence, the parasitic capacitance between the n-type semiconductor region and the p-type semiconductor region is reduced to improve the operating speed (high-frequency characteristics).

In the laser diode according to the second aspect of the present invention, the semiconductor burying region may further include an additional semiconductor burying layer provided between the p-type semiconductor region and the n-type semiconductor burying layer. The additional semiconductor burying layer may be an n-type semiconductor layer. Preferably, the additional semiconductor burying layer is not doped with an element that forms a hole trapping level in a band gap of the additional semiconductor burying layer. In this case, trapping and recombination on a side of the active layer having the highest hole density can be reduced. Therefore, an increase in threshold current due to the loss of holes can be avoided and leakage current can be reduced. Furthermore, in the laser diode according to the second aspect of the present invention, the semiconductor burying region may further include an intermediate semiconductor burying layer provided between the n-type semiconductor burying layer and the p-type semiconductor burying layer, and an additional semiconductor burying layer provided between the p-type semiconductor region and the n-type semiconductor burying layer.

In the laser diode according to the second aspect of the present invention, each of the n-type semiconductor burying layer and the p-type semiconductor burying layer may be composed of a group III-V compound semiconductor.

In the laser diode according to the second aspect of the present invention, each of the n-type semiconductor burying layer and the p-type semiconductor burying layer may be composed of InP.

In the laser diode according to the second aspect of the present invention, the n-type semiconductor burying layer may contain at least one of Si, S, Sn, and Se as the n-type dopant.

In the laser diode according to the second aspect of the present invention, the element that forms a hole trapping level in the band gap of the n-type semiconductor burying layer may be at least one of Ti and Co.

DESCRIPTION OF THE PREFERRED EMBODIMENTS

Figure 1:
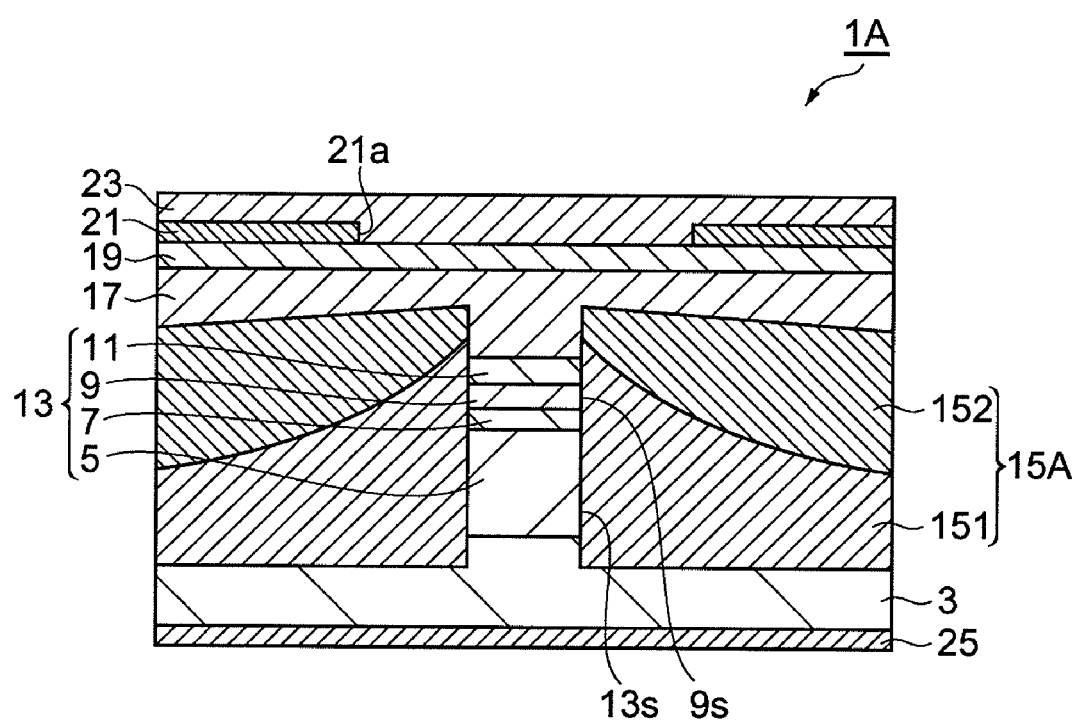
FIG. 1 is a cross-sectional view illustrating the structure of a laser diode according to a first embodiment of the present invention.

A laser diode according to an embodiment will be described in detail below with reference to the attached drawings. In each of the drawings, the same elements are designated using the same reference numerals, if possible. The ratios of dimensions in each component and among the components are not always the same as those of the actual objects described in the respective drawings for the sake of viewability of the drawings.

First Embodiment

A laser diode according to a first embodiment will be described below. FIG. 1 is a cross-sectional view illustrating the structure of a laser diode 1A according to this embodiment. Note that FIG. 1 illustrates a cross section orthogonal to the light-guiding direction of the laser diode 1A.

As illustrated in FIG. 1, the laser diode 1A according to this embodiment has a buried heterostructure (BH) and mainly includes an n-type semiconductor region 3, a semiconductor mesa 13, semiconductor burying regions 15A, and a p-type semiconductor region 17.

In this embodiment, the n-type semiconductor region 3 is an n-type semiconductor substrate. The n-type semiconductor region 3 is composed of, for example, a group III-V compound semiconductor containing an n-type dopant. In this case, the group III-V compound semiconductor may be, for example, InP.

The semiconductor mesa 13 is provided on a main surface of the n-type semiconductor region 3. The semiconductor mesa 13 is provided between the n-type semiconductor region 3 and the p-type semiconductor region 17. The semiconductor mesa 13 has a stripe shape extending along the light-guiding direction of the laser diode 1A. The semiconductor mesa 13 includes at least an active layer 9. In this embodiment, the semiconductor mesa 13 includes an n-type cladding layer 5, a first optical confinement layer 7 provided on the n-type cladding layer 5, the active layer 9 provided on the first optical confinement layer 7, and a second optical confinement layer 11 provided on the active layer 9. The n-type cladding layer 5, the first optical confinement layer 7, the active layer 9, the second optical confinement layer 11, and p-type semiconductor region 17 as a p-type cladding layer constitute an optical waveguide.

The n-type cladding layer 5 is composed of an n-type semiconductor. The n-type cladding layer 5 is composed of, for example, a group III-V compound semiconductor containing an n-type dopant such as silicon (Si). In this case, the group III-V compound semiconductor may be, for example, InP. The impurity concentration of the n-type dopant contained in the n-type cladding layer 5 is, for example, $8 \times 10^{17}$ cm$^{-3}$. The n-type cladding layer 5 supplies the active layer 9 with electrons, which are one of the carriers. The n-type cladding layer 5 is composed of a material having a lower refractive index than that of the active layer 9 and confines light generated in the active layer 9 to a portion near the active layer 9.

The first optical confinement layer 7 and the second optical confinement layer 11 are provided so as to sandwich the active layer 9 therebetween. In this embodiment, the first optical confinement layer 7, the active layer 9, and the second optical confinement layer 11 form a separate confinement heterostructure (SCH).

To minimize the optical absorption loss in the optical waveguide, each of the first optical confinement layer 7 and the second optical confinement layer 11 is usually an undoped semiconductor layer that is not doped with an impurity. Each of the first optical confinement layer 7 and the second optical confinement layer 11 is composed of a group III-V compound semiconductor, for example, GaInAsP or AlGaInAs.

In this embodiment, the p-type semiconductor region 17 is a p-type cladding layer. The p-type semiconductor region 17 is composed of, for example, a group III-V compound semiconductor containing a p-type dopant such as zinc (Zn). In this case, the group III-V compound semiconductor may be, for example, InP. The impurity concentration of the p-type dopant in the p-type semiconductor region 17 is, for example, $1 \times 10^{18}$ cm$^{-3}$. The p-type semiconductor region 17 supplies the active layer 9 with holes, which are one of the carriers. The p-type semiconductor region 17 is composed of a material having a lower refractive index than that of the active layer 9 and confines light generated in the active layer 9 to a portion near the active layer 9.

For example, the active layer 9 has a quantum well structure in which quantum well layers and barrier layers are alternately stacked. The quantum well structure of the active layer 9 may be a single quantum well structure (SQW) or a multiple quantum well structure (MQW). Each of the quantum well layers and the barrier layers included in the active layer 9 is composed of, for example, an undoped group III-V compound semiconductor. For example, the quantum well layers and the barrier layers may be composed of group III-V compound semiconductors, such as GaInAsP and AlGaInAs, having different compositions. Electrons are injected from the n-type cladding layer 5 into the active layer 9 through the first optical confinement layer 7. Holes are injected from the p-type semiconductor region 17 into the active layer 9 through the second optical confinement layer 11. The electrons are recombined with the holes in the active layer 9 to emit light. Alternatively, the active layer 9 may be a single bulk semiconductor layer composed of a group III-V compound semiconductor, for example, GaInAsP or AlGaInAs.

Preferably, the bandgap energy of the first optical confinement layer 7 is lower than the bandgap energy of the n-type cladding layer 5 and is higher than the bandgap energy of the active layer 9. Furthermore, preferably, the bandgap energy of the second optical confinement layer 11 is lower than the bandgap energy of the p-type semiconductor region 17 and is higher than the bandgap energy of the active layer 9. So, electrons injected from the n-type cladding layer 5 are efficiently injected into the active layer 9 through the first optical confinement layer 7. And holes injected from the p-type semiconductor region 17 are efficiently injected into the active layer 9 through the second optical confinement layer 11.

When the relationship among the bandgap energies of the n-type cladding layer 5, the first optical confinement layer 7, the active layer 9, the second optical confinement layer 11, and the p-type semiconductor region 17 described above is satisfied, the refractive index of the first optical confinement layer 7 is higher than that of the n-type cladding layer 5 and is lower than that of the active layer 9. The refractive index of the second optical confinement layer 11 is higher than that of the p-type semiconductor region 17 and is lower than that of the active layer 9. Thus, the n-type cladding layer 5 and the p-type semiconductor region 17 function to confine the carriers (electrons and holes) in the active layer and function to efficiently confine light generated in the active layer 9 to the first optical confinement layer 7, the active layer 9, and the second optical confinement layer 11.

The semiconductor burying regions 15A are located between the n-type semiconductor region 3 and the p-type semiconductor region 17 and are located on the respective side faces 13s of the semiconductor mesa 13. The semiconductor burying regions 15A prevent current from flowing therethrough and concentrate current on the semiconductor mesa 13 including the active layer.

In this embodiment, each of the semiconductor burying regions 15A includes a first burying layer 151 provided on the n-type semiconductor region 3 and a second burying layer 152 provided on the first burying layer 151. That is, each of the second burying layers 152 is provided between the p-type semiconductor region 17 and a corresponding one of the first burying layers 151. Each of the first burying layers 151 is provided between the n-type semiconductor region 3 and a corresponding one of the second burying layers 152.

The first burying layers 151 are composed of a p-type group III-V compound semiconductor. In this case, the group III-V compound semiconductor may be, for example, InP. A p-type dopant doping in the first burying layers 151 may be one selected from, for example, zinc (Zn), beryllium (Be), and magnesium (Mg). Alternatively, two or more of these elements may be used in combination.

The first burying layers 151 are further doped with an element that forms an electron trapping level in the band gap of the first burying layers 151. That is, the first burying layers 151 are doped with the p-type dopant and the element (hereinafter, referred to as an "electron-trapping element") that forms a deep acceptor level in the band gap of the semiconductor. The first burying layers 151 may contain, for example, one or both of iron (Fe) and ruthenium (Ru) as the electron-trapping elements.

The second burying layers 152 are composed of an n-type group III-V compound semiconductor. In this case, the group III-V compound semiconductor may be, for example, InP. An n-type dopant doping in the second burying layers 152 may be, for example, silicon (Si).

The side faces 13s of the semiconductor mesa 13 may be in contact with only the first burying layers 151 as illustrated in FIG. 1, with only the second burying layers 152, or with both of the first burying layers 151 and the second burying layers 152. However, for the case where in the side faces 13s of the semiconductor mesa 13, the side faces 9s of the active layer 9 are in contact with only semiconductor layers composed of a p-type semiconductor (in this embodiment, the first burying layers 151), it is possible to further reduce leakage current from the side faces 13s of the semiconductor mesa 13. For the case where in the side faces 13s of the semiconductor mesa 13, the side faces 9s of the active layer 9 are in contact with only semiconductor layers that do not contain an electron-trapping element (in this embodiment, the second burying layers 152), it is possible to reduce the diffusion of an impurity such as iron, which serves as an electron-trapping element, into the active layer 9. It is generally known that the diffusion of the impurity such as iron into the active layer causes the degradation of the laser diode. Thus, for the case where in the side faces 13s of the semiconductor mesa 13, the side faces 9s of the active layer 9 are in contact with only the semiconductor layers that do not contain the electron-trapping element, the degradation of the characteristics of the laser diode 1A due to the diffusion of the impurity such as iron into the active layer is further suppressed. Furthermore, a portion where the p-type semiconductor region 17 is in contact with the first burying layers 151 preferably has a smaller thickness and, more preferably, has a thickness of 50 nm or less. Alternatively, the p-type semiconductor region 17 may not be in contact with the first burying layers 151.

The p-type semiconductor region 17 is provided on the semiconductor mesa 13 and the semiconductor burying regions 15A. A p-type contact layer 19 is provided on the p-type semiconductor region 17. The p-type contact layer 19 is composed of, for example, a group III-V compound semiconductor, such as GaInAs, doped with zinc (Zn) as a p-type dopant. An insulating layer 21 is provided on the p-type contact layer 19. The insulating layer 21 is composed of, for example, silicon oxide ($SiO_2$). The insulating layer 21 has an opening 21a. A p-type electrode 23 is provided on the p-type contact layer 19 and the insulating layer 21. The p-type electrode 23 is composed of, for example, Ti/Pt/Au and forms an ohmic contact with the p-type contact layer 19 through the opening 21a of the insulating layer 21. An n-type electrode 25 is provided on the backside of the n-type semiconductor region 3. The n-type electrode 25 is composed of, for example, AuGe/Au and forms an ohmic contact with the n-type semiconductor region 3.

The laser diode 1A according to this embodiment described above makes it possible to suppress leakage current that flows from the p-type semiconductor region 17 to the n-type semiconductor region 3 through the semiconductor burying regions 15A. It is thus possible to inject current into the semiconductor mesa 13 including the active layer 9. Next, the principle of operation of the laser diode 1A according to this embodiment will be described.

For the laser diode 1A according to this embodiment, the second burying layers 152 of the semiconductor burying regions 15A are composed of an n-type semiconductor material, thus inhibiting the penetration of holes from the p-type semiconductor region 17 into the semiconductor burying regions 15A. This leads to a reduction in leakage current due to the transfer of holes.

In the laser diode 1A according to this embodiment, furthermore, leakage current due to the transfer of electrons is reduced on the basis of a principle described below.

Figure 2:
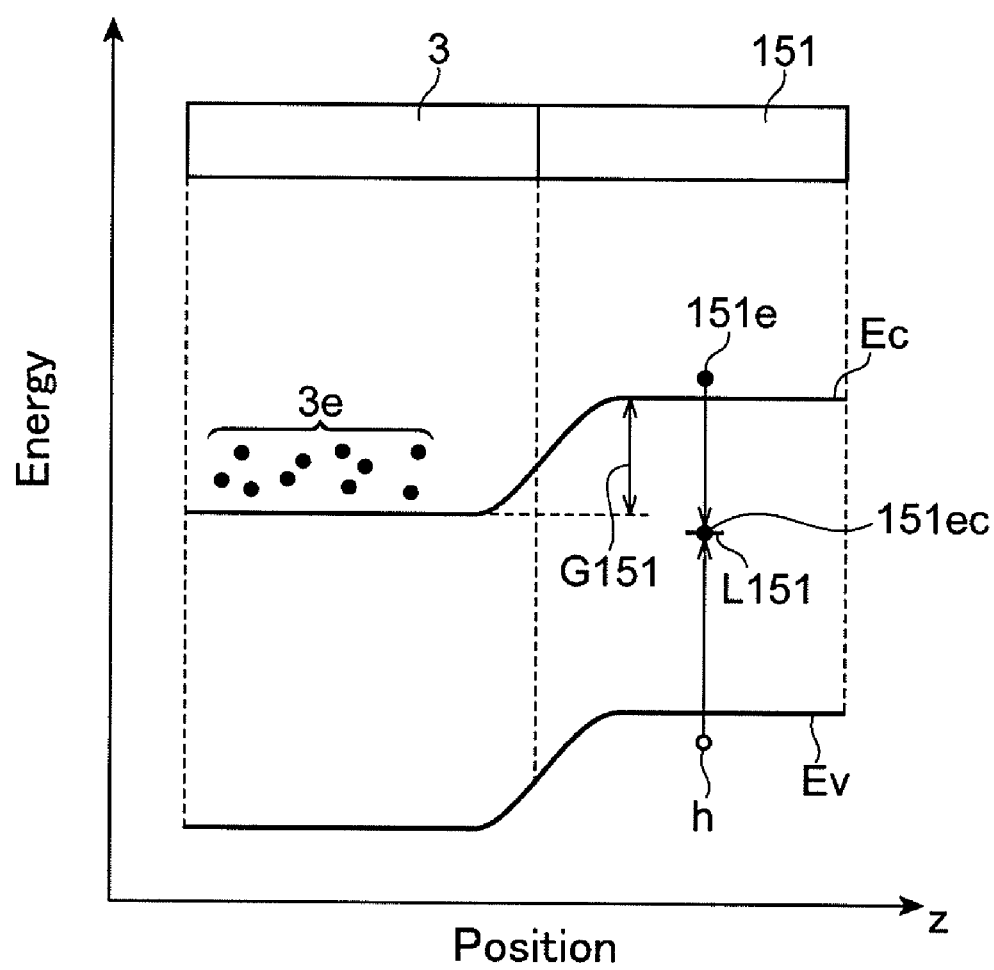
FIG. 2 illustrates a band structure at and near the interface between an n-type semiconductor region and semiconductor burying regions.

FIG. 2 illustrates a band structure at and near the interface between the n-type semiconductor region 3 and the semiconductor burying regions 15A. In FIG. 2, the vertical axis represents the electron energy. The horizontal axis represents a position in the n-type semiconductor region 3 and the first burying layer 151. As illustrated in FIG. 2, a potential barrier G151 in the conduction band Ec is formed between the n-type semiconductor region 3 composed of an n-type semiconductor and the first burying layers 151 composed of a p-type semiconductor. The potential barrier G151 suppresses the transfer of electrons from the n-type semiconductor region 3 to the first burying layers 151. However, some of electrons $3e$ in the conduction band Ec of the n-type semiconductor region 3 can pass over the potential barrier G151 and move to the first burying layers 151. That is, so-called carrier overflow occurs.

However, the first burying layers 151 are doped with the electron-trapping element. Thus, electrons $151e$ that have passed over the potential barrier G151 and have moved to the first burying layers 151 are trapped at an electron trapping level L151 which is in an unoccupied state. The electron trapping level L151 is a level related to the electron-trapping element and is formed in the band gap of the first burying layers 151. Holes h are present in the valence band Ev of the first burying layers 151. Thus, electrons $151ec$ that have been trapped at the electron trapping level L151 are recombined with the holes h in the valence band Ev of the first burying layers 151 to disappear. As a result, the electron trapping level L151 is in an unoccupied state again, so that the foregoing electron-trapping effect at the electron trapping level L151 is recovered. Thus, even if the density of electrons that are transferred to the first burying layers 151 is increased, the electron-trapping effect at the electron trapping level L151 is maintained without saturation. Accordingly, the electrons $151e$ that have been transferred to the first burying layers 151 are effectively prevented from being transferred to the p-type semiconductor region 17 (see FIG. 1).

Therefore, the laser diode 1A according to this embodiment inhibits electrons from being transferred from the n-type semiconductor region 3 to the p-type semiconductor region 17 through the semiconductor burying regions 15A. This makes it possible to inhibit leakage current flowing from the p-type semiconductor region 17 to the n-type semiconductor region 3 through the semiconductor burying regions 15A. Here, it should be noted that the direction of the electron transfer is opposite to the direction of the current flow.

The concentration of the electron-trapping element in each of the first burying layers 151 is preferably $3.0 \times 10^{15}$ cm$^{-3}$ or more for effectively trapping the electrons $151e$. Furthermore, the concentration of the electron-trapping element in each first burying layer 151 is preferably equal to or lower than the solid solubility limit of the electron-trapping element in the semiconductor material constituting the first burying layer 151. If the concentration of the electron-trapping element exceeds the solid solubility limit, the element that does not form a solid solution with each first burying layer 151 does not contribute to the capture of the electrons $151e$. The solid solubility limit of iron (Fe) in InP may be, for example, about $1 \times 10^{18}$ cm$^{-3}$.

The concentration of the p-type dopant in each of the first burying layers 151 is preferably in the range of $1 \times 10^{17}$ cm$^{-3}$ to $3 \times 10^{18}$ cm$^{-3}$. In particular, the concentration is more preferably $1 \times 10^{18}$ cm$^{-3}$ or less. In this case, it is possible to reduce the diffusion of the dopant into the active layer, thus improving the reliability of the device. Furthermore, the concentration of the p-type dopant is preferably higher than the concentration of the electron-trapping element.

The concentration of the n-type dopant in each second burying layer 152 is preferably in the range of $1 \times 10^{18}$ cm$^{-3}$ to $2 \times 10^{18}$ cm$^{-3}$.

Second Embodiment

A laser diode according to a second embodiment will be described below. In the description of this embodiment, elements equal to those in the first embodiment are designated using the same reference numerals, and redundant descriptions are not made, in some cases.

Figure 3:
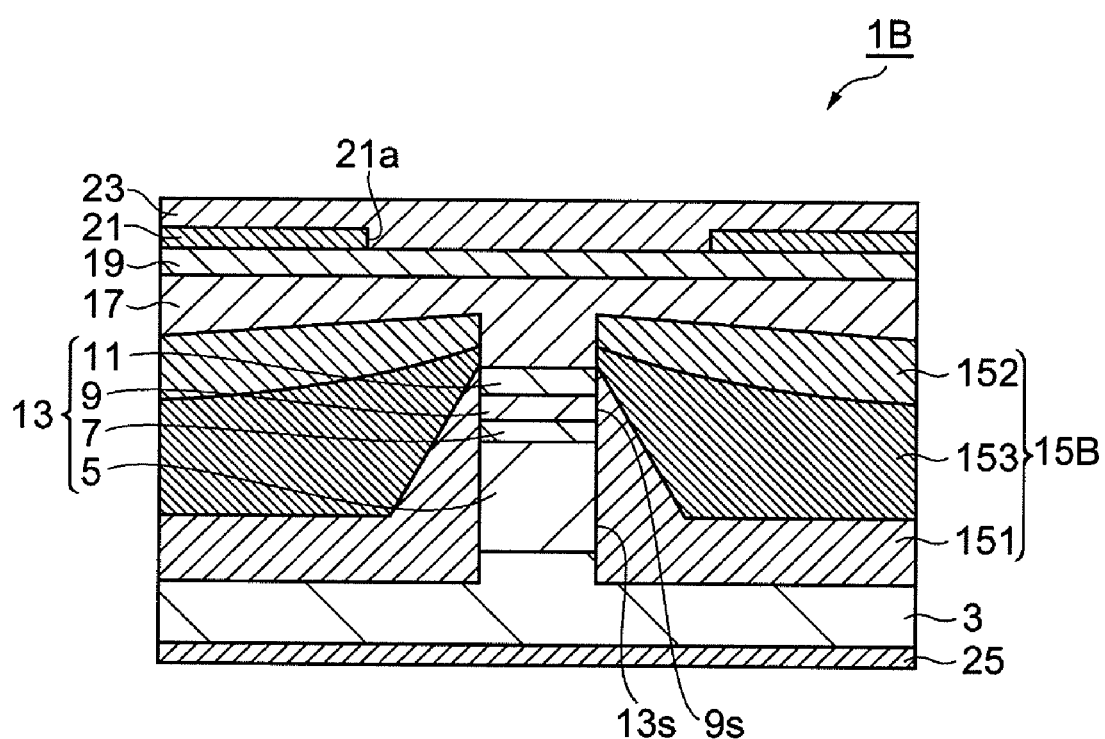
FIG. 3 is a cross-sectional view illustrating the structure of a laser diode according to a second embodiment of the present invention.

FIG. 3 is a cross-sectional view illustrating the structure of a laser diode 1B according to this embodiment. Note that FIG. 3 illustrates a cross section orthogonal to the light-guiding direction of the laser diode 1B.

As illustrated in FIG. 3, the laser diode 1B according to this embodiment differs from the laser diode 1A according to the first embodiment in terms of the structure of the semiconductor burying regions. Specifically, semiconductor burying regions 15B of the laser diode 1B include third burying layers 153 in addition to the elements of the semiconductor burying regions 15A according to the first embodiment. The third burying layers 153 are provided between the first burying layers 151 and the second burying layers 152. The third burying layers 153 are composed of an undoped semiconductor or a semi-insulating semiconductor. Thus, the third burying layers 153 have a higher resistivity than the first burying layers 151 and the second burying layers 152.

The third burying layers 153 are composed of, for example, a group III-V compound semiconductor such as undoped InP.

The third burying layers 153 may be composed of a semi-insulating semiconductor. In this case, the third burying layers 153 are not doped with a p- or n-type dopant. The third burying layers 153 are doped with only an element that forms an electron trapping level in the third burying layers 153. Here, the term "element that forms an electron trapping level" is used to indicate an element that forms a deep acceptor level in the band gap of the semiconductor. The element hat forms a deep acceptor level in the band gap of the semiconductor can trap electrons in the deep acceptor level. Therefore, the semiconductor containing the element that forms an electron trapping level has a higher resistivity. The third burying layers 153 are composed of, for example, a group III-V compound semiconductor such as InP. The third burying layers 153 may contain, for example, one or both of iron (Fe) and ruthenium (Ru) as elements that form electron trapping levels. The concentration of the element that forms the electron trapping level is preferably in the range of $3 \times 10^{15}$ cm$^{-3}$ to $1 \times 10^{18}$ cm$^{-3}$.

For reasons similar to those in the first embodiment, the laser diode 1B according to this embodiment makes it possible to inhibit leakage current flowing from the p-type semiconductor region 17 to the n-type semiconductor region 3 through the semiconductor burying regions 15B.

In the laser diode 1B according to this embodiment, the semiconductor burying regions 15B include the third burying layers 153 composed of a high-resistivity material, as described above. Hence, the parasitic capacitance between the n-type semiconductor region 3 and the p-type semiconductor region 17 is reduced to improve the high-frequency characteristics.

In this embodiment, the side faces 13s of the semiconductor mesa 13 may be in contact with only the first burying layers 151 as illustrated in FIG. 3, only the second burying layers 152, or only the third burying layers 153. Alternatively, each of the side faces 13s of the semiconductor mesa 13 may be in contact with two or more of a corresponding one of the first burying layers 151, a corresponding one of the second burying layers 152, and a corresponding one of the third burying layers 153. Here, for the case where in the side faces 13s of the semiconductor mesa 13, the side faces 9s of the active layer 9 are in contact with only semiconductor layers composed of a p-type semiconductor (in this embodiment, the first burying layers 151), it is possible to reduce leakage current from the side faces 13s of the semiconductor mesa 13. Furthermore, for the case where in the side faces 13s of the semiconductor mesa 13, the side faces 9s of the active layer 9 are in contact with only the semiconductor layers that do not contain an electron-trapping element (in this embodiment, the second burying layers 152 and the third burying layers 153 when the third burying layers 153 are formed of undoped layers), it is also possible to suppress the degradation of the characteristics of the laser diode 1B due to the diffusion of the electron-trapping element into the active layer 9.

Third Embodiment

Figure 4:
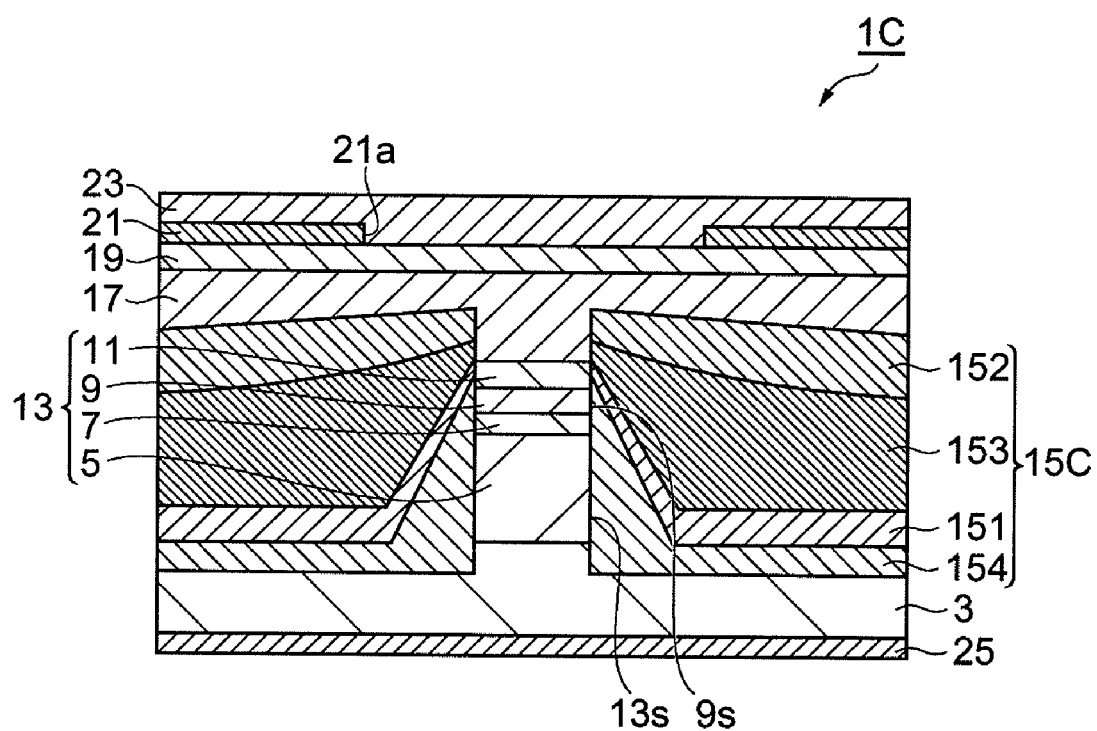
FIG. 4 is a cross-sectional view illustrating the structure of a laser diode according to a third embodiment of the present invention.

A laser diode according to a third embodiment will be described below. In the description of this embodiment, elements equal to those in the first and second embodiments are designated using the same reference numerals, and redundant descriptions are not made, in some cases. FIG. 4 is a cross-sectional view illustrating the structure of a laser diode 1C according to this embodiment. Note that FIG. 4 illustrates a cross section orthogonal to the light-guiding direction of the laser diode 1C.

As illustrated in FIG. 4, the laser diode 1C according to this embodiment differs from the laser diode 1B according to the second embodiment in terms of the structure of the semiconductor burying regions. Specifically, semiconductor burying regions 15C of the laser diode 1C include fourth burying layers 154 in addition to the elements of the semiconductor burying regions 15B according to the second embodiment. The fourth burying layers 154 are provided between the n-type semiconductor region 3 and the first burying layers 151.

The fourth burying layers 154 is composed of a p-type semiconductor, for example, a group III-V compound semiconductor containing a p-type dopant such as zinc (Zn). Note that the fourth burying layers 154 are not doped with an element that forms an electron trapping level in the band gap of the semiconductor. The concentration of the p-type dopant in each fourth burying layer 154 is preferably in the range of $1 \times 10^{17}$ cm$^{-3}$ to $3 \times 10^{18}$ cm$^{-3}$. In particular, the concentration of the p-type dopant is more preferably $1 \times 10^{18}$ cm$^{-3}$ or less.

In this case, it is possible to reduce the diffusion of Zn into the active layer. Then, the reliability of the device can be improved.

For reasons similar to those in the first embodiment, the laser diode 1C according to this embodiment makes it possible to inhibit leakage current flowing from the p-type semiconductor region 17 to the n-type semiconductor region 3 through the semiconductor burying regions 15C.

In the laser diode 1C, the semiconductor burying regions 15C include the fourth burying layers 154 as described above. For the laser diode 1C, trapping and recombination on sides of the active layer 9 having the highest electron density can be reduced. Therefore, an increase in threshold current due to the loss of electrons can be avoided and leakage current can be reduced.

In this embodiment, the side faces 13s of the semiconductor mesa 13 are in contact with only the first burying layers 151 and the fourth burying layers 154 as illustrated in FIG. 4. However, the side faces 13s may be in contact with only the first burying layers 151, the second burying layers 152, the third burying layers 153, or the fourth burying layers 154. Alternatively, each of the side faces 13s may be in contact with two or more of a corresponding one of the first burying layers 151, a corresponding one of the second burying layers 152, a corresponding one of the third burying layers 153, and a corresponding one of the fourth burying layers 154. Here, for the case where in the side faces 13s of the semiconductor mesa 13, the side faces 9s of the active layer 9 are in contact with only semiconductor layers composed of a p-type semiconductor (in this embodiment, the first burying layers 151 and the fourth burying layers 154), it is possible to reduce leakage current from the side faces 13s of the semiconductor mesa 13. Furthermore, for the case where in the side faces 13s of the semiconductor mesa 13, the side faces 9s of the active layer 9 are in contact with only the semiconductor layers that do not contain an electron-trapping element (in this embodiment, the second burying layers 152, the fourth burying layers 154, and the third burying layers 153 when the third burying layers 153 are formed of undoped layers), it is possible to suppress the degradation of the characteristics of the laser diode 1C due to the diffusion of the electron-trapping element into the active layer 9. In particular, for the case where in the side faces 13s of the semiconductor mesa 13, the side faces 9s of the active layer 9 are in contact with only the fourth burying layers 154, it is possible to effectively suppress the diffusion of the electron-trapping element contained in the first burying layers 151 into the active layer because the fourth burying layers 154 are formed between the semiconductor mesa 13 and the first burying layers 151.

In the laser diode 1C according to this embodiment, the semiconductor burying regions 15C may not include the third burying layers 153.

Fourth Embodiment

Figure 5:
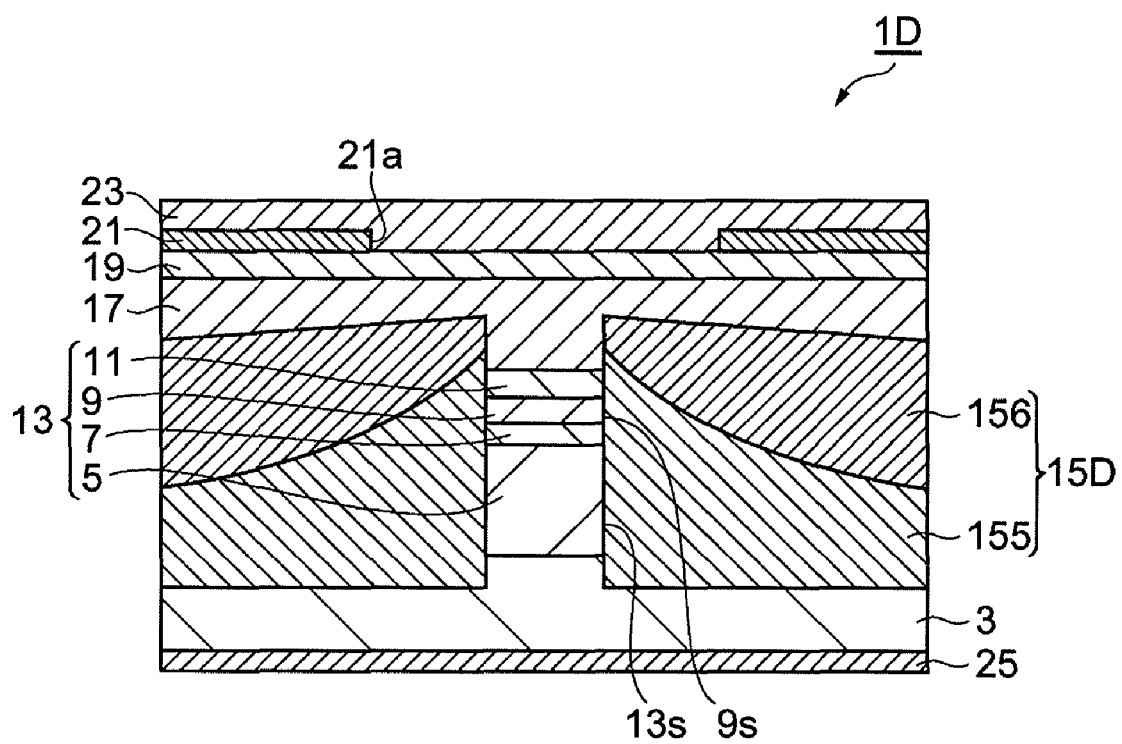
FIG. 5 is a cross-sectional view illustrating the structure of a laser diode according to a fourth embodiment of the present invention.

A laser diode according to a fourth embodiment will be described below. In the description of this embodiment, elements equal to those in the first to third embodiments are designated using the same reference numerals, and redundant descriptions are not made, in some cases. FIG. 5 is a cross-sectional view illustrating the structure of a laser diode 1D according to this embodiment. Note that FIG. 5 illustrates a cross section orthogonal to the light-guiding direction of the laser diode 1D.

As illustrated in FIG. 5, the laser diode 1D according to this embodiment differs from the laser diode 1A according to the first embodiment in terms of the structure of the semiconductor burying regions. Specifically, semiconductor burying regions 15D of the laser diode 1D include fifth burying layers 155 provided on the n-type semiconductor region 3 and sixth burying layers 156 provided on the fifth burying layers 155. Thus, the fifth burying layers 155 are provided between the n-type semiconductor region 3 and the sixth burying layers 156. The sixth burying layers 156 are provided between the p-type semiconductor region 17 and the fifth burying layers 155.

The sixth burying layers 156 are composed of an n-type group III-V compound semiconductor. In this case, the group III-V compound semiconductor may be, for example, InP. The sixth burying layers 156 may contain at least one impurity selected from, for example, silicon (Si), sulfur (S), tin (Sn), and selenium (Se) as the n-type dopant.

The sixth burying layers 156 are further doped with an element that forms a hole trapping level in the band gap of the sixth burying layers 156. That is, the sixth burying layers 156 are doped with the n-type dopant and the element (hereinafter, referred to as a "hole-trapping element") that forms a deep donor level in the band gap of the semiconductor. The sixth burying layers 156 may contain, for example, one or both of titanium (Ti) and cobalt (Co) as the hole-trapping elements.

The fifth burying layers 155 are composed of, for example, a group III-V compound semiconductor containing a p-type dopant such as zinc (Zn). In this case, the group III-V compound semiconductor may be, for example, InP.

The side faces 13s of the semiconductor mesa 13 may be in contact with only the fifth burying layers 155 as illustrated in FIG. 5 or only the sixth burying layers 156. Alternatively, the side faces 13s may be in contact with both the fifth burying layers 155 and the sixth burying layers 156. For the case where in the side faces 13s of the semiconductor mesa 13, the side faces 9s of the active layer 9 are in contact with only semiconductor layers composed of a p-type semiconductor (in this embodiment, the fifth burying layers 155), it is possible to reduce leakage current from the side faces 13s of the semiconductor mesa 13. Furthermore, in this embodiment, it is possible to suppress the degradation of the characteristics of the laser diode 1D due to the diffusion of the hole-trapping element into the active layer 9 because the fifth burying layers 155 are formed of semiconductor layers that do not contain a hole-trapping element. Furthermore, a portion where the p-type semiconductor region 17 is in contact with the fifth burying layers 155 preferably has a smaller thickness and, more preferably, has a thickness of 50 nm or less. Alternatively, the p-type semiconductor region 17 may not be in contact with the fifth burying layers 155.

The laser diode 1D according to this embodiment described above makes it possible to suppress leakage current that flows from the p-type semiconductor region 17 to the n-type semiconductor region 3 through the semiconductor burying regions 15D for the following reasons.

In the laser diode 1D according to this embodiment, the fifth burying layers 155 in the semiconductor burying regions 15D are composed of a p-type semiconductor material, thus inhibiting the penetration of electrons from the n-type semiconductor region 3 into the semiconductor burying regions 15D. This leads to a reduction in leakage current due to the transfer of electrons.

In the laser diode 1D according to this embodiment, furthermore, leakage current due to the transfer of holes is also reduced on the basis of a principle described below.

Figure 6:
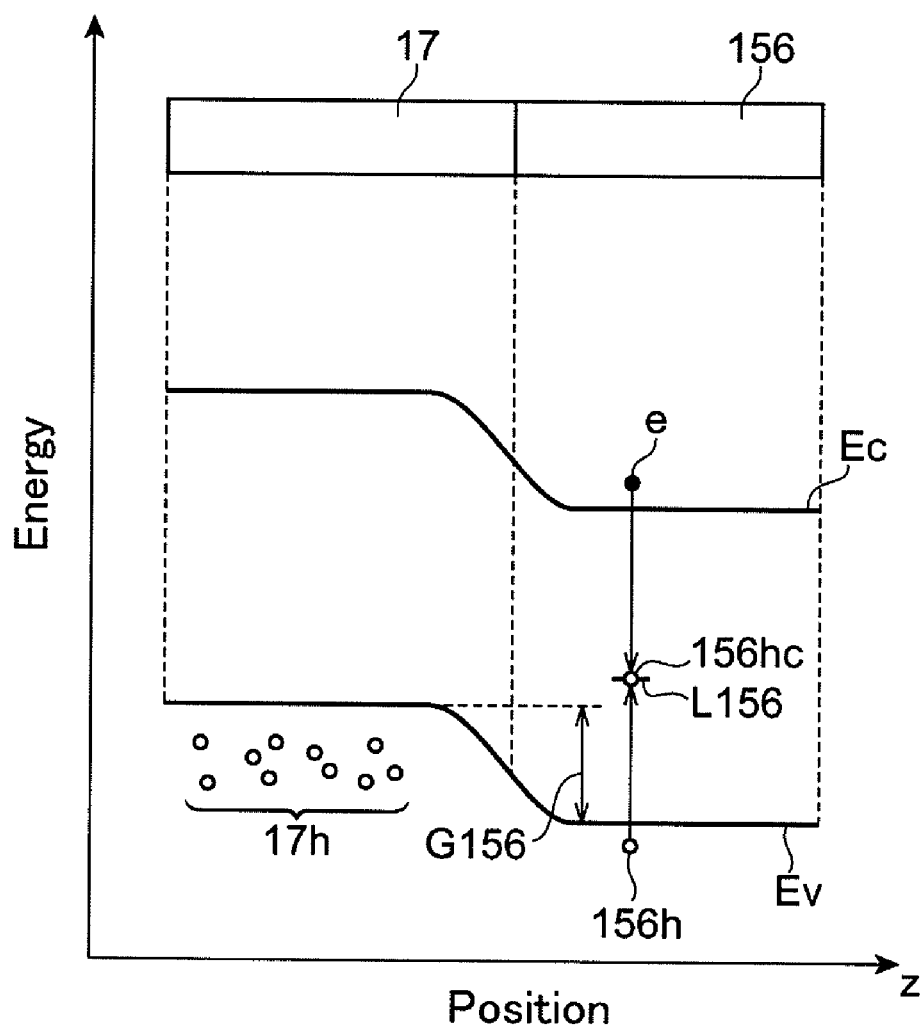
FIG. 6 illustrates a band structure at and near the interface between a p-type semiconductor region and semiconductor burying regions.

FIG. 6 illustrates a band structure at and near the interface between the p-type semiconductor region 17 and the semiconductor burying regions 15D. As illustrated in FIG. 6, a potential barrier G156 in the valence band Ev is formed between the p-type semiconductor region 17 composed of a p-type semiconductor and the sixth burying layers 156 composed of an n-type semiconductor. The potential barrier G156 suppresses the transfer of holes from the p-type semiconductor region 17 to the sixth burying layers 156. However, some of holes 17h in the valence band Ev of the p-type semiconductor region 17 can pass over the potential barrier G156 and move to the sixth burying layers 156.

However, the sixth burying layers 156 are doped with the hole-trapping element. Thus, holes 156h that have passed over the potential barrier G156 formed between the p-type semiconductor region 17 and the sixth burying layers 156 and have moved to the sixth burying layers 156 are trapped at a hole trapping level L156 which is in an unoccupied state. The hole trapping level L156 is a level related to the hole-trapping element and is formed in the band gap of the sixth burying layers 156. Electrons e are present in the conduction band Ec of the sixth burying layers 156. Thus, holes 156hc that have been trapped at the hole trapping level L156 are recombined with the electrons e in the conduction band Ec of the sixth burying layers 156 to disappear. As a result, the hole trapping level L156 is in an unoccupied state again, so that the foregoing hole-trapping effect at the hole trapping level L156 is recovered. Thus, even if the density of holes that are transferred to the sixth burying layers 156 is increased, the hole-trapping effect at the hole trapping level L156 is maintained without saturation. Accordingly, the holes 156h that have been transferred to the sixth burying layers 156 are effectively prevented from being transferred to the n-type semiconductor region 3 (see FIG. 5).

Therefore, the laser diode 1D according to this embodiment inhibits holes from being transferred from the p-type semiconductor region 17 to the n-type semiconductor region 3 through the semiconductor burying regions 15D. This makes it possible to inhibit leakage current flowing from the p-type semiconductor region 17 to the n-type semiconductor region 3 through the semiconductor burying regions 15D.

The concentration of the hole-trapping element in each of the sixth burying layers 156 is preferably $3.0 \times 10^{15}$ cm$^{-3}$ or more from the viewpoint of effectively providing the effect of trapping the holes 156h. Furthermore, the concentration of the hole-trapping element in each sixth burying layer 156 is preferably equal to or lower than the solid solubility limit of the hole-trapping element in the semiconductor material constituting the sixth burying layers 156. If the concentration of the hole-trapping element exceeds the solid solubility limit, the element that does not form a solid solution with each sixth burying layer 156 does not contribute to the capture of the holes 156h.

The concentration of the n-type dopant in each of the sixth burying layers 156 is preferably in the range of $1 \times 10^{17}$ cm$^{-3}$ to $2 \times 10^{19}$ cm$^{-3}$. Furthermore, the concentration of the n-type dopant is preferably higher than the concentration of the hole-trapping element.

The concentration of the p-type dopant in each fifth burying layer 155 is preferably in the range of $1 \times 10^{17}$ cm$^{-3}$ to $3 \times 10^{18}$ cm$^{-3}$.

Fifth Embodiment

A laser diode according to a fifth embodiment will be described below. In the description of this embodiment, elements equal to those in the first to fourth embodiments are designated using the same reference numerals, and redundant descriptions are not made, in some cases.

Figure 7:
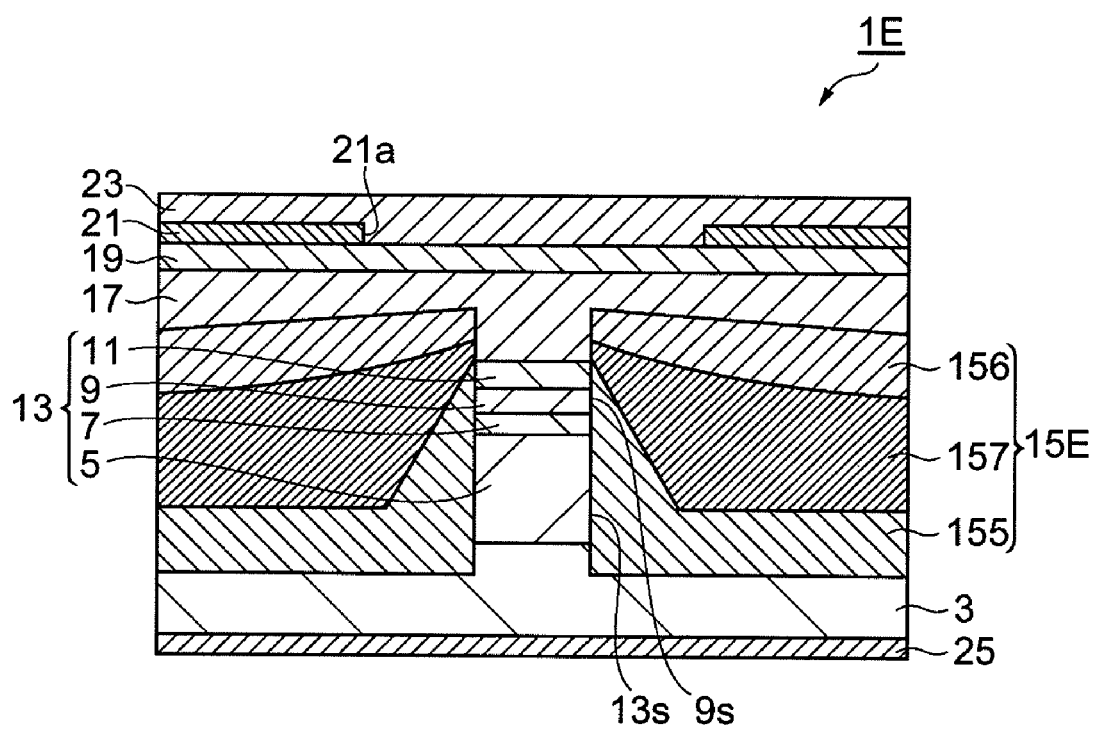
FIG. 7 is a cross-sectional view illustrating the structure of a laser diode according to a fifth embodiment of the present invention.

FIG. 7 is a cross-sectional view illustrating the structure of a laser diode 1E according to this embodiment. Note that FIG.

7 illustrates a cross section orthogonal to the light-guiding direction of the laser diode 1E.

As illustrated in FIG. 7, the laser diode 1E according to this embodiment differs from the laser diode 1D according to the fourth embodiment in terms of the structure of the semiconductor burying regions. Specifically, semiconductor burying regions 15E of the laser diode 1E include a seventh burying layers 157 in addition to the elements of the semiconductor burying regions 15D of the laser diode 1D according to the fourth embodiment. The seventh burying layers 157 are provided between the fifth burying layers 155 and the sixth burying layers 156. The seventh burying layers 157 are composed of an undoped semiconductor or a semi-insulating semiconductor. Thus, the seventh burying layers 157 have a higher resistivity than the fifth burying layers 155 and the sixth burying layers 156.

The seventh burying layers 157 are composed of, for example, a group III-V compound semiconductor such as undoped InP.

The seventh burying layers 157 may be composed of a semi-insulating semiconductor. In this case, the seventh burying layers 157 are not doped with a p- or n-type dopant. The seventh burying layers 157 are doped with only an element that forms a hole trapping level in the seventh burying layers 157. Here, the term "element that forms a hole trapping level" is used to indicate an element that forms a deep donor level in the band gap of the semiconductor. The element hat forms a deep donor level in the band gap of the semiconductor can trap holes in the deep donor level. Therefore, the semiconductor containing the element that forms a hole trapping level has a higher resistivity. The seventh burying layers 157 are composed of, for example, a group III-V compound semiconductor such as InP. The seventh burying layers 157 may contain may contain, for example, one or both of titanium (Ti) and cobalt (Co) as elements that form hole trapping levels.

For reasons similar to those in the fourth embodiment, the laser diode 1E according to this embodiment makes it possible to inhibit leakage current flowing from the p-type semiconductor region 17 to the n-type semiconductor region 3 through the semiconductor burying regions 15E.

In the laser diode 1E according to this embodiment, the semiconductor burying regions 15E include the seventh burying layers 157 composed of a high-resistivity material, as described above. Hence, the parasitic capacitance between the n-type semiconductor region 3 and the p-type semiconductor region 17 is reduced to improve the high-frequency characteristics.

In this embodiment, the side faces 13s of the semiconductor mesa 13 may be in contact with only the fifth burying layers 155 as illustrated in FIG. 7, only the sixth burying layers 156, or only the seventh burying layers 157. Alternatively, each of the side faces 13s of the semiconductor mesa 13 may be in contact with two or more of a corresponding one of the fifth burying layers 155, a corresponding one of the sixth burying layers 156, and a corresponding one of the seventh burying layers 157. Here, for the case where in the side faces 13s of the semiconductor mesa 13, the side faces 9s of the active layer 9 are in contact with only semiconductor layers composed of a p-type semiconductor (in this embodiment, the fifth burying layers 155), it is possible to reduce leakage current from the side faces 13s of the semiconductor mesa 13. Furthermore, for the case where in the side faces 13s of the semiconductor mesa 13, the side faces 9s of the active layer 9 are in contact with only the semiconductor layers that do not contain a hole-trapping element (in this embodiment, the fifth burying layers 155 and the seventh burying layers 157 when the seventh burying layers 157 are formed of undoped layers), it is also possible to suppress the degradation of the characteristics of the laser diode 1E due to the diffusion of the hole-trapping element into the active layer 9.

Sixth Embodiment

Figure 8:
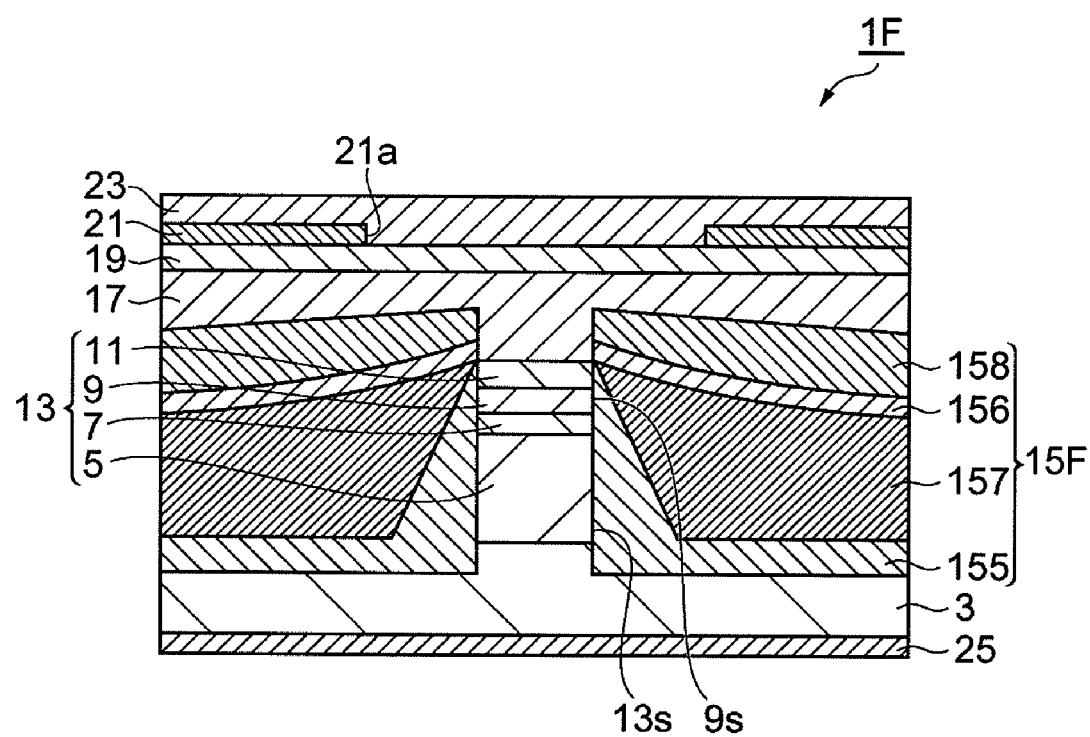
FIG. 8 is a cross-sectional view illustrating the structure of a laser diode according to a sixth embodiment of the present invention.

A laser diode according to a sixth embodiment will be described below. In the description of this embodiment, elements equal to those in the first to fifth embodiments are designated using the same reference numerals, and redundant descriptions are not made, in some cases. FIG. 8 is a cross-sectional view illustrating the structure of a laser diode 1F according to this embodiment. Note that FIG. 8 illustrates a cross section orthogonal to the light-guiding direction of the laser diode 1F.

As illustrated in FIG. 8, the laser diode 1F according to this embodiment differs from the laser diode 1E according to the fifth embodiment in terms of the structure of the semiconductor burying regions. Specifically, semiconductor burying regions 15F of the laser diode 1F include an eighth burying layers 158 in addition to the elements of the semiconductor burying regions 15E according to the fifth embodiment. The eighth burying layers 158 are provided between the p-type semiconductor region 17 and the sixth burying layers 156.

The eighth burying layers 158 are composed of an n-type semiconductor, for example, a group III-V compound semiconductor containing an n-type dopant such as silicon (Si). The eighth burying layers 158 are not doped with an element that forms a hole trapping level in the band gap of the eighth burying layers 158. The concentration of the n-type dopant in each of the eighth burying layers 158 is preferably in the range of $1 \times 10^{17}$ cm$^{-3}$ to $2 \times 10^{19}$ cm$^{-3}$.

For reasons similar to those in the fourth embodiment, the laser diode 1F according to this embodiment makes it possible to inhibit leakage current flowing from the p-type semiconductor region 17 to the n-type semiconductor region 3 through the semiconductor burying regions 15F.

In the laser diode 1F, the semiconductor burying regions 15F include the eighth burying layers 158 as described above. For the laser diode 1F, trapping and recombination on sides of the active layer 9 having the highest hole density can be reduced. Therefore, an increase in threshold current due to the loss of holes can be avoided and leakage current can be reduced.

In this embodiment, the side faces 13s of the semiconductor mesa 13 are in contact with only the fifth burying layers 155 as illustrated in FIG. 8. However, the side faces 13s may be in contact with only the sixth burying layers 156, the seventh burying layers 157, or the eighth burying layers 158. Alternatively, each of the side faces 13s may be in contact with two or more of a corresponding one of the fifth burying layers 155, a corresponding one of the sixth burying layers 156, a corresponding one of the seventh burying layers 157, and a corresponding one of the eighth burying layers 158. Here, for the case where in the side faces 13s of the semiconductor mesa 13, the side faces 9s of the active layer 9 are in contact with only semiconductor layers composed of a p-type semiconductor (in this embodiment, the fifth burying layers 155), it is possible to reduce leakage current from the side faces 13s of the semiconductor mesa 13. Furthermore, for the case where in the side faces 13s of the semiconductor mesa 13, the side faces 9s of the active layer 9 are in contact with only the semiconductor layers that do not contain a hole-trapping element (in this embodiment, the fifth burying layers 155, the eighth burying layers 158, and the seventh burying layers 157 when the seventh burying layers 157 are formed of undoped layers), it is possible to suppress the degradation of the characteristics of the laser diode 1F due to the diffusion of the hole-trapping element into the active layer 9.

In the laser diode 1F according to this embodiment, the semiconductor burying regions 15F may not include the seventh burying layers 157.

The present invention is not limited to the embodiments described above. Various modifications may be made.

For example, each of the laser diodes 1A, 1B, 1C, 1D, 1E, and 1F according to the foregoing embodiments includes the n-type semiconductor substrate (see FIGS. 1, 3 to 5, 7, and 8). Each of the laser diodes 1A, 1B, 1C, 1D, 1E, and 1F may include a p-type semiconductor substrate or a semi-insulating semiconductor substrate that has a semiconductor layer (e.g., a buffer layer) composed of an n-type semiconductor or a p-type semiconductor on a main surface of the substrate.

When each of the laser diodes 1A, 1B, 1C, 1D, 1E, and 1F includes the p-type semiconductor substrate, the n-type semiconductor substrate in each of the foregoing embodiments is replaced with the p-type semiconductor substrate. Furthermore, the p-type semiconductor region 17 is replaced with an n-type semiconductor region. In this case, the semiconductor substrate serves as a p-type semiconductor region. The n-type semiconductor region serves as, for example, an n-type cladding layer that is composed of, for example, a group III-V compound semiconductor containing an n-type dopant such as silicon (Si). The p$^+$ contact layer 19 is replaced with an n$^+$ contact layer. The p-type electrode 23 is replaced with an n-type electrode. The n-type electrode 25 is replaced with a p-type electrode. Furthermore, the order of lamination of the layers in each of the semiconductor burying regions 15A, 15B, 15C, 15D, 15E, and 15F is reversed.

When each of the laser diodes 1A, 1B, 1C, 1D, 1E, and 1F includes the semi-insulating semiconductor substrate that has a semiconductor layer (e.g., a buffer layer) composed of an n-type semiconductor on a main surface of the substrate, the n-type semiconductor substrate in each of the foregoing embodiments is replaced with the semi-insulating semiconductor substrate. A semiconductor layer composed of an n-type semiconductor is provided between the semi-insulating semiconductor substrate and the semiconductor mesa 13 and between the semi-insulating semiconductor substrate and each of the semiconductor burying regions 15A, 15B, 15C, 15D, 15E, and 15F. The semiconductor layer serves as an n-type semiconductor region. The n-type electrode 25 is provided so as to be electrically connected to the semiconductor layer.

When each of the laser diodes 1A, 1B, 1C, 1D, 1E, and 1F includes the semi-insulating semiconductor substrate that has a semiconductor layer (e.g., a buffer layer) composed of a p-type semiconductor on a main surface of the substrate, the n-type semiconductor substrate in each of the foregoing embodiments is replaced with the semi-insulating semiconductor substrate. A semiconductor layer composed of a p-type semiconductor is provided between the semi-insulating semiconductor substrate and the semiconductor mesa 13 and between the semi-insulating semiconductor substrate and each of the semiconductor burying regions 15A, 15B, 15C, 15D, 15E, and 15F. The semiconductor layer serves as a p-type semiconductor region. Furthermore, the p-type semiconductor region 17 in each of the foregoing embodiments is replaced with an n-type semiconductor region. In this case, the n-type semiconductor region serves as, for example, an n-type cladding layer that is composed of, for example, a group III-V compound semiconductor containing an n-type dopant such as silicon (Si). The p$^+$ contact layer 19 is replaced with an n$^+$ contact layer. The p-type electrode 23 is replaced with an n-type electrode. The n-type electrode 25 is replaced with a p-type electrode that is electrically connected to the semiconductor layer. Moreover, the order of lamination of the layers in each of the semiconductor burying regions 15A, 15B, 15C, 15D, 15E, and 15F is reversed.

The principles of the present invention have been described with preferred embodiments with reference to the drawings. However, it will be apparent to one skilled in the art that the present invention can be changed in terms of arrangement and details without departing from the principles. The present invention is not restricted to the specific configurations disclosed in the embodiments. We therefore claim all modifications and variations coming within the spirit and scope of the following claims.

What is claimed is:

1. A laser diode comprising:
an n-type semiconductor region;
a p-type semiconductor region;
a semiconductor mesa provided between the n-type semiconductor region and the p-type semiconductor region, the semiconductor mesa including an active layer; and
a semiconductor burying region located between the n-type semiconductor region and the p-type semiconductor region, the semiconductor burying region being provided on a side face of the semiconductor mesa, wherein
the semiconductor burying region includes a p-type semiconductor burying layer provided on the n-type semiconductor region and an n-type semiconductor burying layer provided on the p-type semiconductor burying layer, and
the p-type semiconductor burying layer is doped with both of a p-type dopant and an electron-trapping element that forms a deep acceptor level in a band gap of the p-type semiconductor burying layer and traps electrons in the p-type semiconductor burying layer.

2. The laser diode according to claim 1, wherein the p-type semiconductor burying layer has a higher concentration of the p-type dopant than that of the electron-trapping element doped in the p-type semiconductor burying layer.

3. The laser diode according to claim 1, wherein the semiconductor burying region further includes an intermediate semiconductor burying layer provided between the n-type semiconductor burying layer and the p-type semiconductor burying layer, the intermediate semiconductor burying layer being composed of an undoped semiconductor or a semi-insulating semiconductor.

4. The laser diode according to claim 1, wherein
the semiconductor burying region further includes an additional semiconductor burying layer provided between the n-type semiconductor region and the p-type semiconductor burying layer,
the additional semiconductor burying layer is a p-type semiconductor layer, and
the additional semiconductor burying layer is not doped with an electron-trapping element that forms a deep acceptor level in a band gap of the additional semiconductor burying layer.

5. The laser diode according to claim 1, wherein the semiconductor burying region further includes:
an intermediate semiconductor burying layer provided between the n-type semiconductor burying layer and the p-type semiconductor burying layer, and
an additional semiconductor burying layer provided between the n-type semiconductor region and the p-type semiconductor burying layer, and wherein the intermediate semiconductor burying layer is composed of an undoped semiconductor or a semi-insulating semiconductor, the additional semiconductor burying layer is a p-type semiconductor layer, and the additional semiconductor burying layer is not doped with an electron-trapping element that forms a deep acceptor level in a band gap of the additional semiconductor burying layer.

6. The laser diode according to claim 1, wherein each of the n-type semiconductor burying layer and the p-type semiconductor burying layer is composed of a group III-V compound semiconductor.

7. The laser diode according to claim 1, wherein each of the n-type semiconductor burying layer and the p-type semiconductor burying layer is composed of InP.

8. The laser diode according to claim 1, wherein the p-type semiconductor burying layer contains at least one of Zn, Be, and Mg as the p-type dopant.

9. The laser diode according to claim 1, wherein the electron-trapping element doped in the p-type semiconductor burying layer is at least one of Fe and Ru.

10. A laser diode comprising:
an n-type semiconductor region;
a p-type semiconductor region;
a semiconductor mesa provided between the n-type semiconductor region and the p-type semiconductor region, the semiconductor mesa including an active layer; and
a semiconductor burying region located between the n-type semiconductor region and the p-type semiconductor region, the semiconductor burying region being provided on a side face of the semiconductor mesa, wherein
the semiconductor burying region includes a p-type semiconductor burying layer provided on the n-type semiconductor region and an n-type semiconductor burying layer provided on the p-type semiconductor burying layer, and
the n-type semiconductor burying layer is doped with both of a n-type dopant and a hole-trapping element that forms a deep donor level in a band gap of the n-type semiconductor burying layer and traps holes in the n-type semiconductor burying layer.

11. The laser diode according to claim 10, wherein the n-type semiconductor burying layer has a higher concentration of the n-type dopant than that of the hole trapping element doped in the n-type semiconductor burying layer.

12. The laser diode according to claim 10,
wherein the semiconductor burying region further includes an intermediate semiconductor burying layer provided between the n-type semiconductor burying layer and the p-type semiconductor burying layer, and
wherein the intermediate semiconductor burying layer is composed of an undoped semiconductor or a semi-insulating semiconductor.

13. The laser diode according to claim 10, wherein
the semiconductor burying region further includes an additional semiconductor burying layer provided between the p-type semiconductor region and the n-type semiconductor burying layer,
the additional semiconductor burying layer is an n-type semiconductor layer, and
the additional semiconductor burying layer is not doped with a hole-trapping element that forms a deep donor level in a band gap of the additional semiconductor burying layer.

14. The laser diode according to claim 10, wherein the semiconductor burying region further includes:
an intermediate semiconductor burying layer provided between the n-type semiconductor burying layer and the p-type semiconductor burying layer, and
an additional semiconductor burying layer provided between the p-type semiconductor region and the n-type semiconductor burying layer, and wherein the intermediate semiconductor burying layer is composed of an undoped semiconductor or a semi-insulating semiconductor,
the additional semiconductor burying layer is an n-type semiconductor layer, and
the additional semiconductor burying layer is not doped with a hole-traping element that forms a deep donor level in a band gap of the additional semiconductor burying layer.

15. The laser diode according to claim 10, wherein each of the n-type semiconductor burying layer and the p-type semiconductor burying layer is composed of a group III-V compound semiconductor.

16. The laser diode according to claim 10, wherein each of the n-type semiconductor burying layer and the p-type semiconductor burying layer is composed of InP.

17. The laser diode according to claim 10, wherein the n-type semiconductor burying layer contains at least one of Si, S, Sn, and Se as the n-type dopant.

18. The laser diode according to claim 10, wherein the hole-trapping element doped in the n-type semiconductor burying layer is at least one of Ti and Co.

* * * * *